United States Patent
Kim et al.

(10) Patent No.: US 8,427,563 B2
(45) Date of Patent: Apr. 23, 2013

(54) IMAGE SENSOR WITH MULTIPLE TYPES OF COLOR FILTERS

(75) Inventors: Gi-Bum Kim, Yongin-si (KR); Yun-Ki Lee, Seoul (KR); Duck-Hyung Lee, Sungnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 371 days.

(21) Appl. No.: 12/583,813

(22) Filed: Aug. 26, 2009

(65) Prior Publication Data
US 2010/0053387 A1 Mar. 4, 2010

(30) Foreign Application Priority Data

Aug. 26, 2008 (KR) ........................ 10-2008-0083464

(51) Int. Cl.
*H04N 3/14* (2006.01)
*H04N 5/335* (2006.01)
*H04N 9/04* (2006.01)

(52) U.S. Cl.
USPC ........................................................ 348/273

(58) Field of Classification Search .................. 348/273
See application file for complete search history.

(56) References Cited

U.S. PATENT DOCUMENTS

| | | | |
|---|---|---|---|
| 2002/0190254 A1* | 12/2002 | Turner et al. | 257/59 |
| 2005/0167774 A1* | 8/2005 | Rhodes et al. | 257/443 |
| 2007/0187793 A1* | 8/2007 | Moon et al. | 257/440 |
| 2008/0218461 A1* | 9/2008 | Sugita et al. | 345/88 |

OTHER PUBLICATIONS

U.S. Patent Publication No. 2007/0076105 to Inokuma, having Publication date of Apr. 5, 2007 (w/ English Abstract page).
Japanese Patent Publication No. JP2006229078 to Yuichi et al., having Publication date of Aug. 31, 2006 (w/ English Abstract page).
Japanese Patent Publication No. JP2007103401 to Kazuyuki, having Publication date of Apr. 19, 2007 (w/ English Abstract page).
Japanese Patent Publication No. JP2007165646 to Shinko, having Publication date of Jun. 28, 2001 (w/ English Abstract page).

* cited by examiner

*Primary Examiner* — Usman Khan
(74) *Attorney, Agent, or Firm* — Monica H. Choi

(57) ABSTRACT

An image sensor includes a plurality of photoelectric conversion devices formed in a substrate and first and second color filters. The first color filter is formed over a first photoelectric conversion device and comprised of an organic material. The second color filter is formed over a second photoelectric conversion device and comprised of a plurality of inorganic layers. With such different types of color filters, spectral characteristic of the image sensor are enhanced.

17 Claims, 10 Drawing Sheets

IMAGE SENSOR WITH MULTIPLE TYPES OF COLOR FILTERS

BACKGROUND OF THE INVENTION

This application claims priority under 35 USC §119 to Korean Patent Application No. 10-2008-0083464, filed on Aug. 26, 2008 in the Korean Intellectual Property Office, the disclosure of which is incorporated herein in its entirety by reference.

1. Field of the Invention

The present invention relates generally to image sensors, and more particularly, to an image sensor having different types of color filters.

2. Background of the Invention

An image sensor transforms images into electrical signals. Recent advances in computer and communication industries demand high performance image sensors in various consumer electronic devices including digital cameras, camcorders, PCS (Personal Communication Systems), game devices, security cameras, and medical micro cameras.

A MOS (metal oxide semiconductor) image sensor is driven easily using various scanning methods. Also, a digital signal processing circuit is integrated into a single chip of the MOS image sensor for minimized product size. In addition, MOS process technology is used for fabrication of the MOS image sensor for reduced manufacturing cost. Furthermore, the MOS image sensor has low power consumption for application in battery-powered products. Accordingly, use of MOS image sensors has been rapidly increasing with advances in implementation of high resolution MOS image sensors.

A MOS image sensor is typically divided into two regions: a sensor array region where multiple unit pixels are formed, and a surrounding peripheral circuit region where circuits to control/drive the multiple unit pixels are formed. The sensor array region includes multiple photoelectric conversion devices and multiple MOS transistors, and the surrounding circuit region includes multiple MOS transistors forming the circuits.

The sensor array region and the surrounding circuit region are integrated on one substrate, and the transistors formed in the sensor array region and the surrounding circuit region are formed simultaneously. Also, for increasing condensing efficiency, multiple lenses are formed for respective multiple photoelectric conversion devices. Furthermore, a protection layer composed of LTO (Low Temperature Oxide) is typically formed on the multiple lenses.

When a MOS image sensor includes a green color filter composed of organic material, a transmittance of less than 90% has been measured for the green color filter transmitting light near a wavelength of 550 nm. Such low transmittance degrades the optical characteristics of the image sensor in a spectral transmittance graph with loss of incident light reaching the photoelectric conversion element. Thus, the optical characteristics of the image sensor are deteriorated in that case.

SUMMARY OF THE INVENTION

Accordingly, an image sensor includes multiple types of color filters for enhancing the transmittance of light through the color filters.

An image sensor of an aspect of the present invention includes a plurality of photoelectric conversion devices formed in a substrate and first and second color filters. The first color filter is formed over a first photoelectric conversion device and comprised of an organic material. The second color filter is formed over a second photoelectric conversion device and comprised of a plurality of inorganic layers.

In an embodiment of the present invention, the second color filter is comprised of alternating layers of a first inorganic material having a first refractive index and a second inorganic material having a second refractive index different from the first refractive index. For example, the first refractive index is higher than the second refractive index.

In an example embodiment of the present invention, the second color filter includes a lowest inorganic layer disposed closest to the substrate, with the lowest inorganic layer comprised of the first inorganic material. In addition, the second color filter includes a highest inorganic layer disposed furthest from the substrate, with the highest inorganic layer comprised of the first inorganic material.

In another embodiment of the present invention, the second color filter includes highest and lowest inorganic layers that are thicker than a first intermediate inorganic layer disposed between the highest and lowest inorganic layers with the highest and lowest inorganic layers and the first intermediate inorganic layer being comprised of the first inorganic material. In addition, the second color filter includes outward inorganic layers that are thinner than a second intermediate inorganic layer disposed between the outward inorganic layers with the outward inorganic layers and the second intermediate inorganic layer being comprised of the second inorganic material.

In an example embodiment of the present invention, the first refractive index of the first inorganic material is in a range of from about 1.8 to about 3.0, and the second refractive index of the second inorganic material is in a range of from about 1.2 to about 1.8. For example, the first inorganic material is comprised of at least one of $TiO_2$, $SiON$, $Si_3N_4$, $Ta_2O_3$, and $ZrO_2$, and the second inorganic material is comprised of at least one of an oxide material, a nitride material, and an oxynitride material.

In a further embodiment of the present invention, the image sensor further includes light transmitting structures formed between the respective color filters and the respective photoelectric conversion elements, and also includes respective lenses formed over the color filters.

In another embodiment of the present invention, the second color filter abuts the first color filter within a sensor array region of the image sensor. A third color filter is formed over a third photoelectric conversion device and comprised of an organic material, and the second color filter abuts the third color filter within the sensor array region of the image sensor.

In a further embodiment of the present invention, the second color filter abuts a plurality of color filters, each comprised of an organic material.

In an example embodiment of the present invention, the second color filter transmits green light while blocking other colors of light with the second color filter transmitting green light with substantially 100% transmission efficiency.

Alternatively, the second color filter transmits blue light or red light while blocking other colors of light.

In a further embodiment of the present invention, each of the inorganic layers has a respective thickness that is an integer multiple of $\lambda/(4ni)$, with $\lambda$ being a central wavelength of light transmitted by the second color filter, and with $ni$ being a respective refractive index of each inorganic layer of the second color filter.

In another embodiment of the present invention, the first color filter and the second color filter have a substantially same thickness.

The present invention may be used for the image sensor being a CMOS (complementary metal oxide semiconductor) image sensor. However, the present invention may be used for other types of image sensors.

In this manner, the image sensor has enhanced transmission efficiency with such multiple types of first and second color filters.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6A, 6B, 7, 8, and 9 refer to elements having similar structure and/or function.

DETAILED DESCRIPTION OF THE INVENTION

Advantages and features of the present invention and methods of accomplishing the same are understood more readily by reference to the following detailed description of preferred embodiments and the accompanying drawings. The present invention may, however, be embodied in many different forms and should not be construed as being limited to the embodiments set forth herein.

Rather, these embodiments are provided so that this disclosure will be thorough and complete and will fully convey the concept of the invention to those skilled in the art, and the present invention will only be defined by the appended claims. In some exemplary embodiments, well-known processes, structures, and technologies are not explained specifically in order to avoid ambiguous interpretation of the invention.

In the following description, it will be understood that when an element is referred to as being "connected to" or "coupled to" another element, it can be directly connected to or coupled to the other element or intervening elements may also be present. In contrast, when an element is referred to as being "directly connected to" or "directly coupled to" another element, there are no intervening elements present. Like reference numerals refer to like elements throughout the specification. The terms "and/or" comprise each and at least one combination of referenced items.

Although terminology such as "the first" and "the second" are used to describe various elements, components, and/or sections, such elements, components, and/or sections are not limited to the terminology. Such terminology is used to distinguish one element, component, and/or section from another element, component, and/or section. Therefore, the first element, the first component, and the first section mentioned in the present invention may be the second element, the second component, and the second section within the technical concept.

Terminologies in this specification are to explain the exemplary embodiments of the present invention, and not to limit the present invention. Unless specifically stated, a word in singular form also represents the plural form. The terms "comprise" and "comprising" used in the specification may include components, steps, operations and devices specifically mentioned, as well as other components, steps, and operations, and devices. Like reference numerals refer to like elements throughout the specification.

Unless otherwise defined, all the terminologies (including technical and scientific terminologies) used in the present invention are as may be understood by one of ordinary skill in the art of this invention. Also, terminologies defined in widely-used dictionaries should not be over-interpreted.

Figure 1:
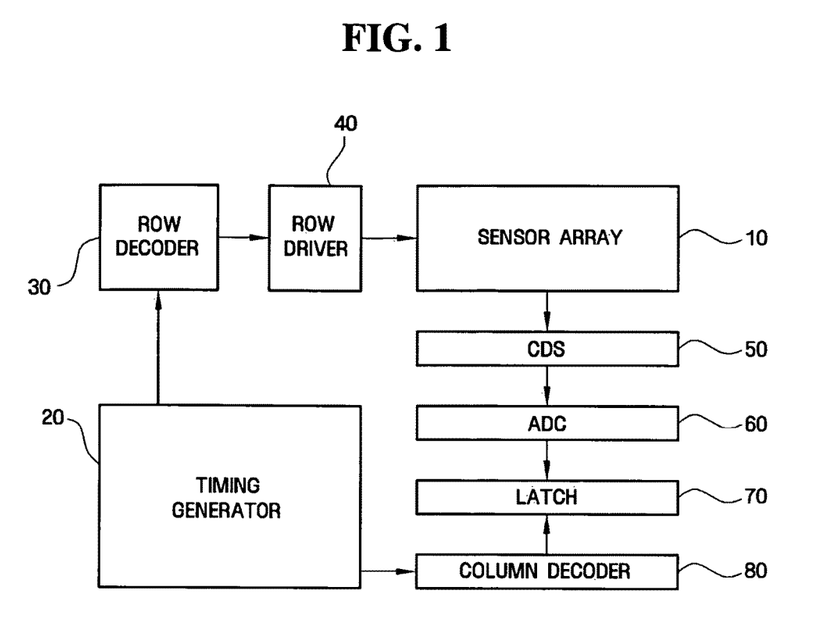
FIG. 1 is a block diagram of an image sensor having multiple types of color filters, according to an example embodiment of the present invention.

FIG. 1 shows a block diagram of an image sensor according to an example embodiment of the present invention. The image sensor of FIG. 1 includes a sensor array 10 having a two dimensional matrix of photoelectric conversion devices. The image sensor of FIG. 1 also includes a timing generator 20, a row decoder 30, a row driver 40, a Correlated Double Sampler (CDS) 50, an Analog to Digital Converter (ADC) 60, a latch 70, and a column decoder 80.

The sensor array 10 includes unit pixels arranged in two dimensions for transforming images into electrical signals. The sensor array 10 is driven by multiple driving signals from the row driver 40 including a row selection signal, a reset control signal, and a transmit control signal. Also, electrical output signals are transmitted to the CDS 50 through vertical signal lines.

The timing generator 20 provides the row decoder 30 and the column decoder 80 with timing and control signals. According to the decoding results from the row decoder 30, the row driver 40 provides the active pixel sensor array 10 with multiple driving signals to drive the unit pixels. When the unit pixels are arranged as a two-dimensional matrix, the driving signals are provided to each row.

The CDS 50 samples and holds electrical signals generated from the active pixel sensor array 10 through vertical signal lines. In particular, the CDS 50 samples a noise level and an image signal level from a unit pixel of the active pixel sensor array 10 to generate a difference between such noise and image signal levels. The ADC 60 generates a digital signal by converting such a difference that is an analog signal. The latch 70 latches the digital signal from the ADC 60 that is sequentially sent to an image signal processor (not shown) according to decoding results from the column decoder 80.

Figure 2:
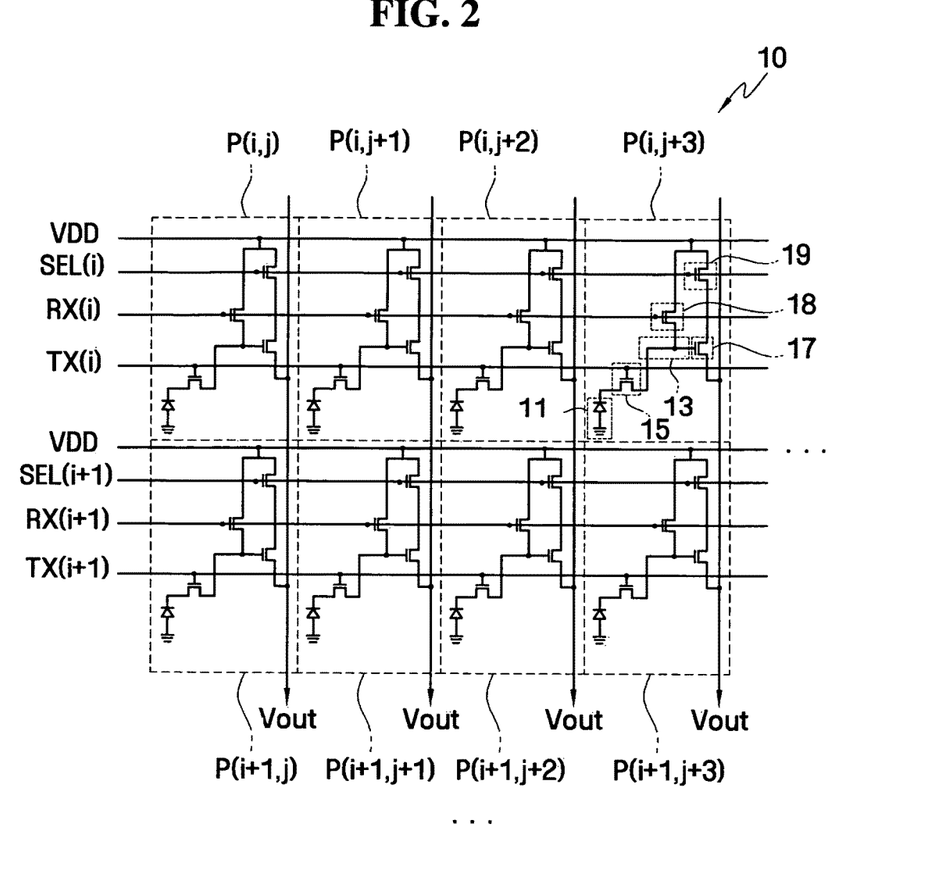
FIG. 2 shows a circuit diagram of a sensor array in the image sensor of FIG. 1, according to an example embodiment of the present invention.

FIG. 2 shows a circuit diagram of the sensor array 10 in FIG. 1, according to an embodiment of the present invention. Referring to FIG. 2, pixels P are arranged in a two-dimensional matrix in the sensor array 10. Each pixel P includes a respective photoelectric conversion device 11, a respective floating diffusion region 13, a respective charge transmission device 15, a respective drive device 17, a respective reset device 18, and a respective selection device 19.

The charge transmission device 15, the drive device 17, the reset device 18, and the selection device 19 are MOSFETs (metal oxide semiconductor field effect transistors) such that the image sensor of FIG. 1 is a CMOS (complementary metal oxide semiconductor field effect transistor) image sensor, in an example embodiment of the present invention.

Example operation of the sensor array 10 is now described for an ith row of pixels P(i, j), P(i, j+1), P(i, j+2), P(i, j+3), . . . . The photoelectric conversion device 11 absorbs incident light and accumulates an amount of electric charge corresponding to an intensity of such incident light. The photoelectric conversion device 11 may be a photo diode, a photo transistor, a photo gate, a pinned photo diode, or a combination of such devices. FIG. 2 shows the photoelectric conversion device 11 as a photo diode.

The photoelectric conversion device 11 is coupled to the charge transmission device 15 which transmits the accumulated electric charge from the photoelectric conversion device 11 to the floating diffusion region 13. The floating diffusion region FD 13 has a parasitic capacitance for storing and transforming such accumulated charge to a voltage. The drive device 17 is configured as a source follower amplifier that amplifies a change of the electrical potential at the floating diffusion region 13 to generate an electrical signal at an output line Vout.

The reset device 18 periodically resets the floating diffusion region 13. The reset device 18 is driven by the reset control signal applied on a reset line RX(i). When the reset device 18 is turned on by the reset control signal at the reset line RX(i), a reset voltage such as a power source voltage VDD is applied to the floating diffusion region 13 through the reset device 18.

The selection device 19 selects the pixel P to be read in each row. The selection device 19 is driven by the row selection signal applied on a row selection line SEL(i). When the selection device 19 is turned on by the row selection signal, the power source voltage VDD is applied at a drain of the drive device 17 through the selection device 19 for turning on the drive device 17. The transmission line TX(i), the reset line RX(i), and the row selection line SEL(i) are arranged to extend parallel with each other in the row direction of the sensor array 10.

Figure 3:
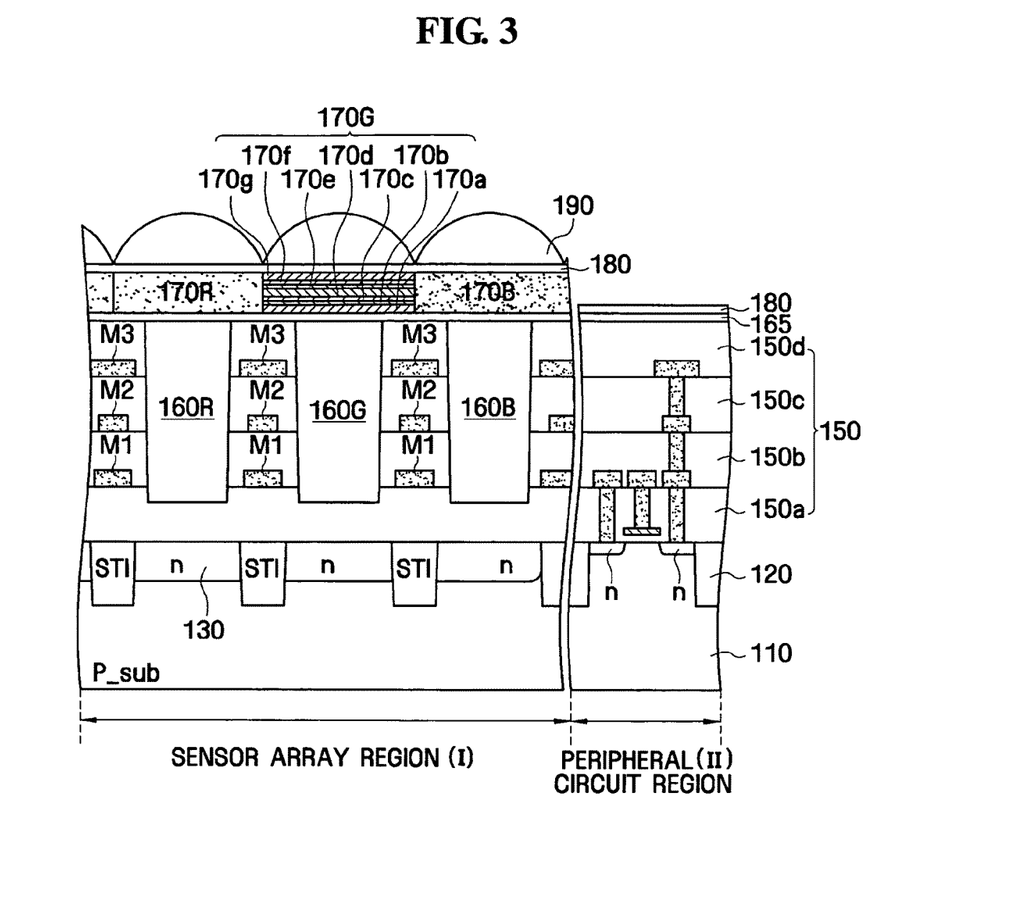
FIG. 3 shows a cross sectional view of the image sensor of FIG. 1, according to a first example embodiment of the present invention.

FIG. 3 shows a cross sectional view of the image sensor of FIG. 1, according to a first example embodiment of the present invention. FIG. 3 shows a sensor array region I and a peripheral circuit region II of the image sensor with mainly the photoelectric conversion devices of the sensor array 10 being shown in the sensor array region I.

In FIG. 3, the sensor array 10 is formed in the sensor array region I, and the timing generator 20, the row decoder 30, the row driver 40, the CDS 50, the ADC 60, the latch unit 70, and the column decoder 80 are formed in the peripheral circuit region II. Also, although not illustrated in the drawing, the peripheral circuit region II may be formed to surround the sensor array region I.

In the sensor array region I, the floating diffusion regions, the photoelectric conversion devices 130, and the multiple read devices are formed for the sensor array 10. The read devices include the charge transmission devices 15, the drive devices 17, the reset devices 18, and the selection devices 19 of the unit pixels of the sensor array 10. The peripheral circuit region II includes MOS devices, resistors, and capacitors formed therein. Since such elements may be individually and generally implemented by one of ordinary skill in the art, a detailed description thereof is omitted herein.

Further referring to FIG. 3, the image sensor is formed in a substrate 110 that may be a semiconductor substrate such as a silicon substrate having P-type conductivity for example. A device isolation region 120 such as a STI (Shallow Trench Isolation) region is formed in the substrate 110 for defining an active region therein. Such an active region is mainly divided into the two regions of the sensor array region I and the peripheral circuit region II.

Although not illustrated, an epitaxial layer may be formed on the substrate 110, and multiple wells may be formed in the substrate 110. For example, a SOI (silicon on insulator) substrate including a lower silicon substrate, a buried insulating layer formed on the lower silicon substrate, and a silicon semiconductor layer formed on the buried insulating layer may be used as the substrate 110.

The device isolation region 120 in the sensor array region I partitions each unit pixel having a respective photoelectric conversion device 130 formed therein. A photo transistor, a photo gate, a photo diode, a pinned photo diode, or a combination of such devices may be used as the photoelectric conversion device 130. FIG. 3 shows a photo diode as the photoelectric conversion device 130 for example.

Further referring to FIG. 3, a dielectric layer structure 150 is formed on the substrate 110. The dielectric layer structure 150 includes a first dielectric layer 150a, a first interconnection layer M1 formed on the first dielectric layer 150a, a second dielectric layer 150b formed on the first interconnection layer M1, a second interconnection layer M2 formed on the second dielectric layer 150b, a third dielectric layer 150c formed on the second interconnection layer M2, a third interconnection layer M3 formed on the third dielectric layer 150c, and a fourth dielectric layer 150d formed on the third interconnection layer M3.

The interconnect structures of the first, second, and third interconnection layers M1, M2, and M3 overlap the device isolation region 120. Thus, incident light is not blocked and reaches the photoelectric conversion devices 130. In addition, reflection of incident light from sides of the first, second, and third interconnection layers M1, M2, and M3 guides such incident light toward the photoelectric conversion devices 130. Such reflection also prevents incident light from reaching adjacent unit pixels for minimizing optical crosstalk between the unit pixels.

In the example embodiment of FIG. 3, the first, second, and third interconnection layers M1, M2, and M3 are illustrated as being formed onto the first, second, and third dielectric layers 150a, 150b, and 150c, respectively. However, the present invention is not limited thereto. For example, any of the first, second, and third interconnection layers M1, M2, and M3 may be a damascene interconnect structure.

In addition, the present invention may be practiced with the dielectric layer structure 150 having different numbers of dielectric and interconnection layers in the sensor array region I and the peripheral circuit region II. In that case, the dielectric layer structures 150 in the sensor array region I and the peripheral circuit region II would have different heights. For example, by reducing the number of the interconnection and dielectric layers of the dielectric layer structure 150 in the sensor array region I, the height of the dielectric layer structure 150 in the sensor array region I would be reduced. Such a reduced number of the interconnection and dielectric layers is amenable for increasing the amount of incident light reaching the photoelectric conversion devices 130 for enhanced sensitivity of the image sensor.

For further increasing sensitivity of the image sensor, light transmitting structures 160R, 160G, and 160B are formed through the dielectric structure 150 over respective photoelectric conversion devices 130. Any of the first, second, or third dielectric layers 150a, 150b, or 150c having low light transmittance hinders incident light from arriving at the photoelectric conversion devices 130.

Accordingly, openings are formed through the first, second, and third dielectric layers 150a, 150b, and 150c over the photoelectric conversion devices 130. Additionally, such openings are filled with a light transmitting material to form the light transmitting structures 160R, 160G, and 160B.

In an example embodiment of the present invention, the light transmitting structures 160R, 160G, and 160B are comprised of an organic high-molecular compound such as fluoropolymer (Cytop™) having a ring structure or a PMMA polymer for example. However, the present invention is not limited thereto, and the present invention may be practiced with omission of the light transmitting structures 160R, 160G, and 160B especially when the first, second, and third dielectric layers 150a, 150b, and 150c have high light transmittance.

FIG. 3 illustrates the light transmitting structures 160R, 160G, and 160B being formed by partial removal of the first dielectric layer 150a. However, the present invention is not limited thereto, and the light transmitting structures 160R, 160G, and 160B may be formed in any combination of the first, second, and third dielectric layers 150a, 150b, and 150c. Also, the light transmitting structures 160R, 160G, and 160B may be formed with a sloped sidewall and a flat bottom or with a vertical sidewall or a concave/convex bottom, in example embodiments of the present invention.

In the sensor array region I, a lower planarization layer 165, color filters 170R, 170G, and 170B, an upper planarization layer 180, and lenses 190 are formed sequentially on the dielectric layer structure 150. Similarly in the peripheral circuit region II, the lower planarization layer 165 and the upper planarization layer 180 are formed sequentially on the dielectric layer 150. Here, any of the lower planarization layer 165 and the upper planarization layer 180 may be excluded selectively in the sensor array region I and the peripheral circuit region II. The lenses 190 are comprised of an organic material such as photosensitive resin or of an inorganic material, in an example embodiment of the present invention.

The color filter 170R transmits light components near the red color frequency, the color filter 170G transmits light components near the green color frequency, and the color filter 170B transmits light components near the blue color frequency. The red color filter 170R and the blue color filter 170B are comprised of a photosensitive organic material, and the green color filter 170G is comprised of a stack of a plurality of inorganic materials, in a first embodiment of the present invention. In an example embodiment of the present invention, the color filters 170R, 170B, and 170G are formed with a same thickness.

The green color filter 170G has a plurality of high refractive index inorganic layers 170a, 170c, 170e, and 170g and a plurality of low refractive index inorganic layers 170b, 170d, and 170f that are stacked alternately. The high refractive index inorganic layers 170a, 170c, 170e, and 170g are comprised of a first inorganic material having a first refractive index, and the low refractive index inorganic layers 170b, 170d, and 170f are comprised of a second inorganic material having a second refractive index that is lower than the first refractive index.

The green color filter 170G includes a lowest inorganic layer 170a disposed closest to the substrate 110, and includes a highest inorganic layer 170g disposed furthest from the substrate 110. In one example embodiment of the present invention, the lowest and highest inorganic layers 170a and 170g are comprised of the first inorganic material having the higher first refractive index such that the green color filter 170G transmits green light with substantially 100% transmittance and with relatively wide bandwidth for improved spectral characteristics of the image sensor.

For example, the first inorganic material having the higher first refractive index may include an oxide material, a nitride material, an oxynitride material, or a combination thereof, with a refractive index in a range of from about 1.8 to about 3.0. For example, such a first inorganic material may be comprised of at least one of $TiO_2$, $SiON$, $Si_3N_4$, $Ta_2O_3$, $ZrO_2$, or a combination thereof.

Also, the second inorganic material having the lower second refractive index may include an oxide material, a nitride material, an oxynitride material, or a combination thereof, with a refractive index in a range of from about 1.2 to about 1.8. For example, such a second inorganic material may be comprised of $SiO_2$.

The example of FIG. 3 illustrates four inorganic layers 170a, 170c, 170e, and 170g having the higher first refractive index being stacked alternately with three inorganic layers 170b, 170d, and 170f having the lower second refractive index. However, the present invention may be practiced with any number of such alternating layers.

The respective thickness of each of the inorganic layers 170a, 170b, 170c, 170d, 170e, 170f, and 170g is an integer multiple of $\lambda/(4ni)$, according to an example embodiment of the present invention. Here, $\lambda$ is a central wavelength of light transmitted by the green color filter 170G, and ni is a respective refractive index of each of the inorganic layers 170a, 170b, 170c, 170d, 170e, 170f, and 170g.

Of the inorganic layers 170a, 170c, 170e, and 170g having the higher first refractive index, the lowest and highest inorganic layers 170a and 170g are formed to be thicker than intermediate inorganic layers 170c and 170e disposed between the lowest and highest inorganic layers 170a and 170g. Similarly of the inorganic layers 170b, 170d, and 170f having the lower second refractive index, outward inorganic layers 170b and 170f disposed furthest and closest to the substrate 110 are formed to be thinner than an intermediate inorganic layer 170d disposed between the outward inorganic layers 170b and 170f. With such multiple inorganic layers, the green color filter 170G has substantially 100% transmittance in the green frequency region of a corresponding spectral transmittance graph with relatively wide bandwidth for improved spectral characteristics of the image sensor.

Figure 4:
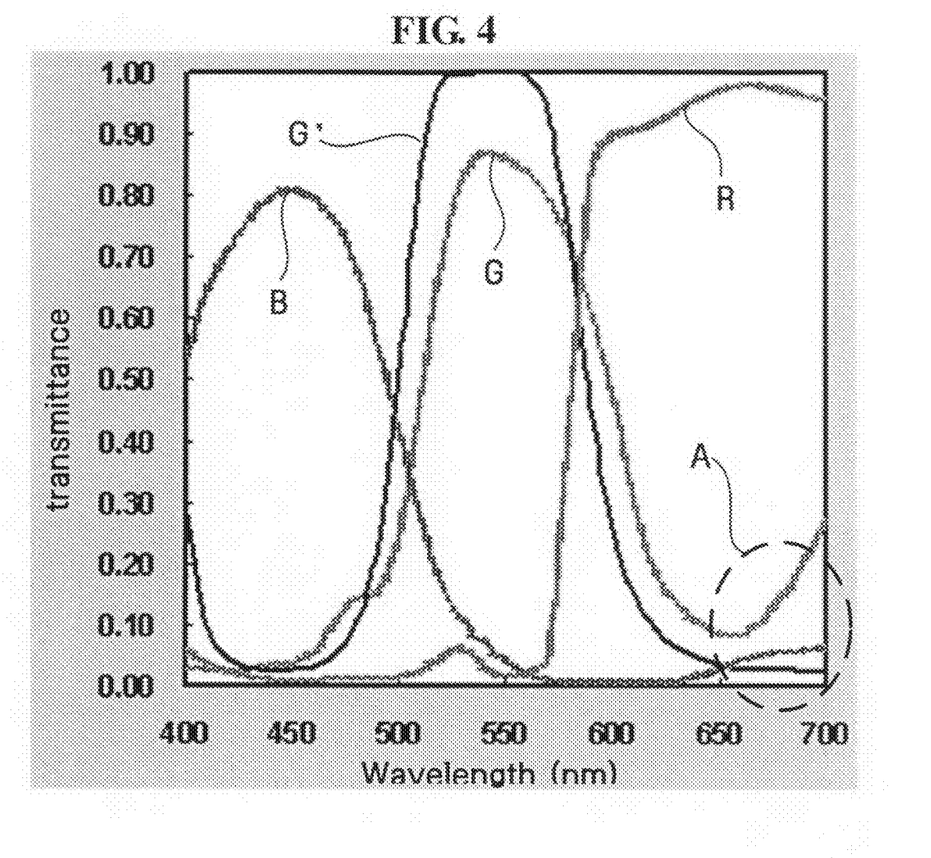
FIGS. 4 and 5 are graphs illustrating measurements of spectral transmittance of an image sensor according to example embodiments of the present invention.
Figure 5:
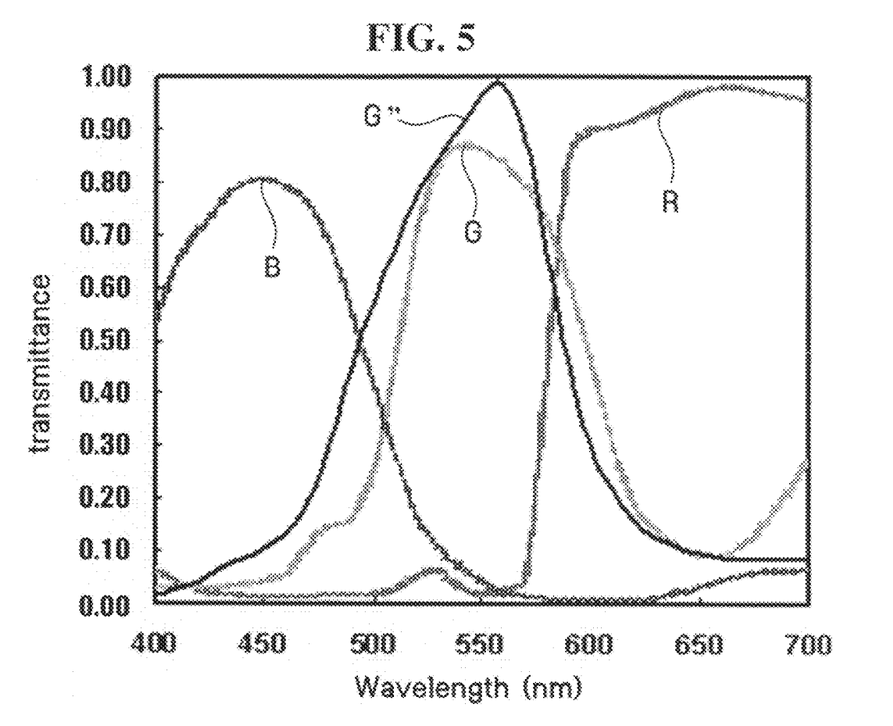

FIGS. 4 and 5 are graphs illustrating measurements of spectral transmittance of an image sensor according to an example embodiment of the present invention. Referring to FIG. 4, B, R, and G indicate respective light transmittances of blue, red, and green color filters, each comprised of a respective organic material. In addition, G' indicates light transmittance of the green color filter 170G comprised of multiple inorganic layers as described in reference to FIG. 3 for example. In particular in FIG. 4, G' is for a color filter comprised of layers of $TiO_2$ having a refractive index of 2.8 stacked alternately with layers of $SiO_2$ having a refractive index of 1.46, with thicknesses of the inorganic layers being 180 nm, 90 nm, 45 nm, 185 nm, 45 nm, 92 nm, and 180 nm, sequentially.

As illustrated in FIG. 4, the transmittance G for an organic green color filter is measured to be less than 90% at about 550 nm. In contrast, the transmittance G' for the green color filter 170G having multiple inorganic layers is substantially 100% at about 550 nm. Furthermore in a long wavelength region A of FIG. 4, crosstalk transmittance is detected for the organic green color filter G, but such crosstalk transmittance is minimized for the green color filter transmittance G' with the multiple inorganic layers.

Referring to FIG. 5, B, R, and G indicate respective light transmittances of blue, red, and green color filters, each comprised of a respective organic material. In addition in FIG. 5, G" indicates light transmittance of a green color filter comprised of multiple inorganic layers similarly as described in reference to FIG. 3 for example. In particular in FIG. 5, G" is for a green color filter comprised of layers of SiON with a higher refractive index stacked alternately with layers of $SiO_2$ having a lower refractive index.

As illustrated in FIG. 5, the transmittance G for an organic green color filter is measured to be less than 90% at about 550 nm. In contrast, the transmittance G" for the green color filter having multiple inorganic layers is substantially 100% at about 550 nm. Furthermore in FIG. 5, crosstalk transmittance is detected for the organic green color filter G, but such crosstalk transmittance is minimized for the green color filter transmittance G" with the multiple inorganic layers.

Figure 6A:
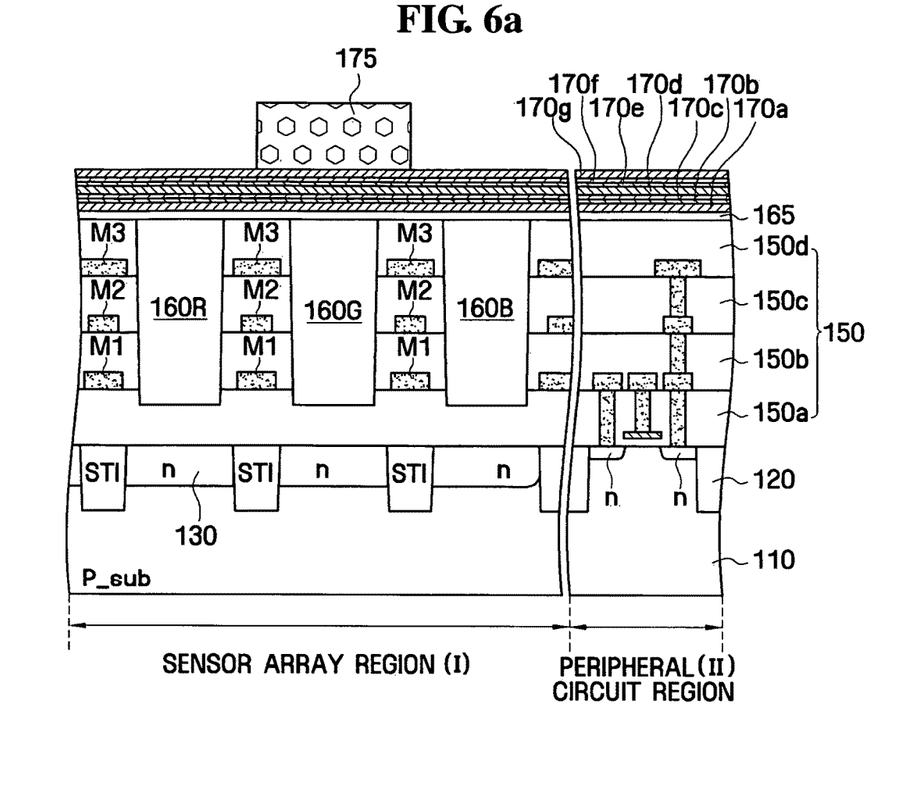
FIGS. 6A and 6B show cross sectional views illustrating fabrication of the image sensor of FIGS. 1 and 3, according to an example embodiment of the present invention.
Figure 6B:
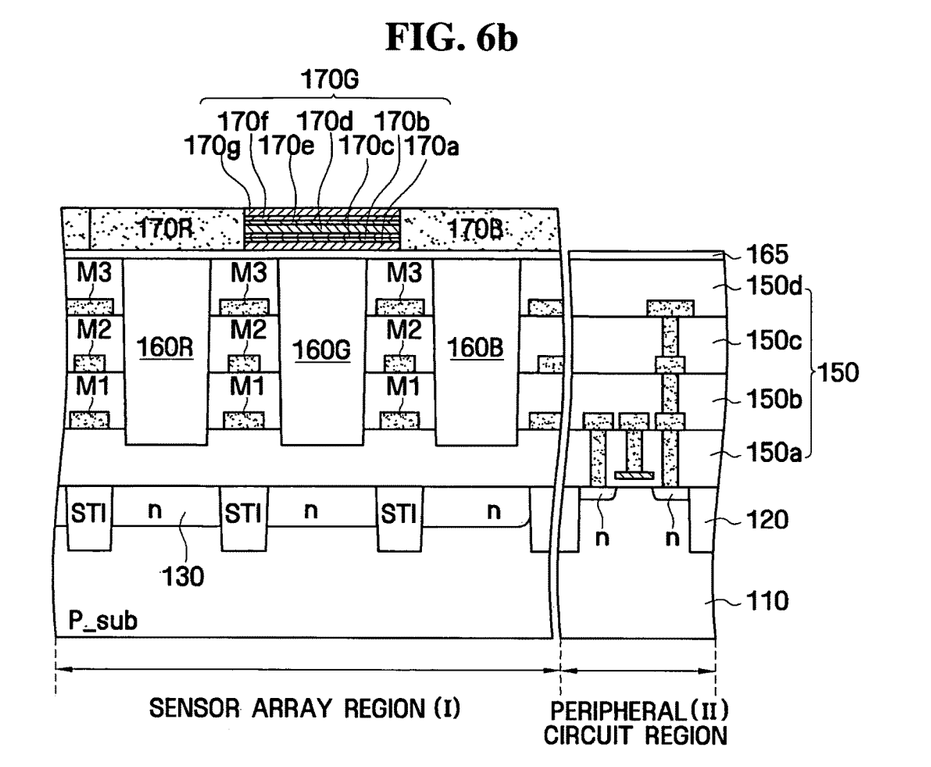

A method of fabricating the image sensor of FIG. 3 is now described in reference to FIGS. 6A and 6B according to a first example embodiment of the present invention. FIGS. 6A and 6B show cross sectional views illustrating fabrication of the image sensor of FIGS. 1 and 3, according to an example embodiment of the present invention.

Referring to FIG. 6A, the device isolation region 120 defines the sensor array region I and the peripheral circuit region II in the substrate 110. Next, the photoelectric conversion devices 130 are formed in the sensor array region I. In addition, the multiple read elements are also formed in the sensor array region I as multiple MOS elements are formed in the peripheral circuit region II.

Subsequently, the dielectric layer structure 150 is formed over the photoelectric conversion devices 130 of the substrate 110. Next, the lower planarization layer 165 is formed on the dielectric layer structure 150. Thereafter, the first, second, third, fourth, fifth, sixth, and seventh inorganic layers 170a, 170b, 170c, 170d, 170e, 170f, and 170g, respectively, are sequentially formed on the lower planarization layer 165.

The first, third, fifth, and seventh inorganic layers 170a, 170c, 170e, and 170g are comprised of the first inorganic material having the higher first refractive index such as a high refractive oxide material, nitride material, or oxynitride material. The second, fourth, and sixth inorganic layers 170b, 170d, and 170f are comprised of the second inorganic material having the lower second refractive index.

Subsequently in FIG. 6B, a photosensitive layer pattern 175 is formed on the seventh inorganic layer 170g to be overlapped with the light transmitting structure 160G over the light conversion element 130 for receiving green light. Thereafter in FIG. 6B, exposed portions of the inorganic layers 170a, 170b, 170c, 170d, 170e, 170f, and 170g are etched away to form the green color filter 170G. The green color filter 170G is formed from the portion of the inorganic layers 170a, 170b, 170c, 170d, 170e, 170f, and 170g remaining under the photosensitive layer pattern 175.

Subsequently, the red color filter 170R comprised of a photosensitive resin is formed on the lower planarization layer 165 to abut the green color filter 170G. The red color filter 170R is formed by spin coating of the photosensitive resin that is an organic material for example and by photo and develop processes. The red color filter 170R is formed to overlap the light transmitting structure 160R formed over the photoelectric conversion device 130 for receiving red light.

In addition, the blue color filter 170B comprised of a photosensitive resin is formed on the lower planarization layer 165 to abut the green color filter 170G. The blue color filter 170B is formed by spin coating of the photosensitive resin that is an organic material for example and by photo and develop processes. The blue color filter 170B is formed to overlap the light transmitting structure 160B formed over the photoelectric conversion device 130 for receiving blue light.

The present invention may be practiced with any order for forming the red color filter 170R and the blue color filter 170B. With the Bayer color filter pattern, the green color filter 170G comprised of multiple inorganic materials is surrounded by red and blue color filters, each comprised of a respective organic material.

Next referring to FIGS. 6B and 3, the upper planarization layer 180 is formed on the red and blue color filters 170R and 170B and on the green color filter 170G. Subsequently referring to FIG. 3, the lenses 190 are formed on the upper planarization layer 180 over the color filters 170R, 170G, and 170B.

Figure 7:
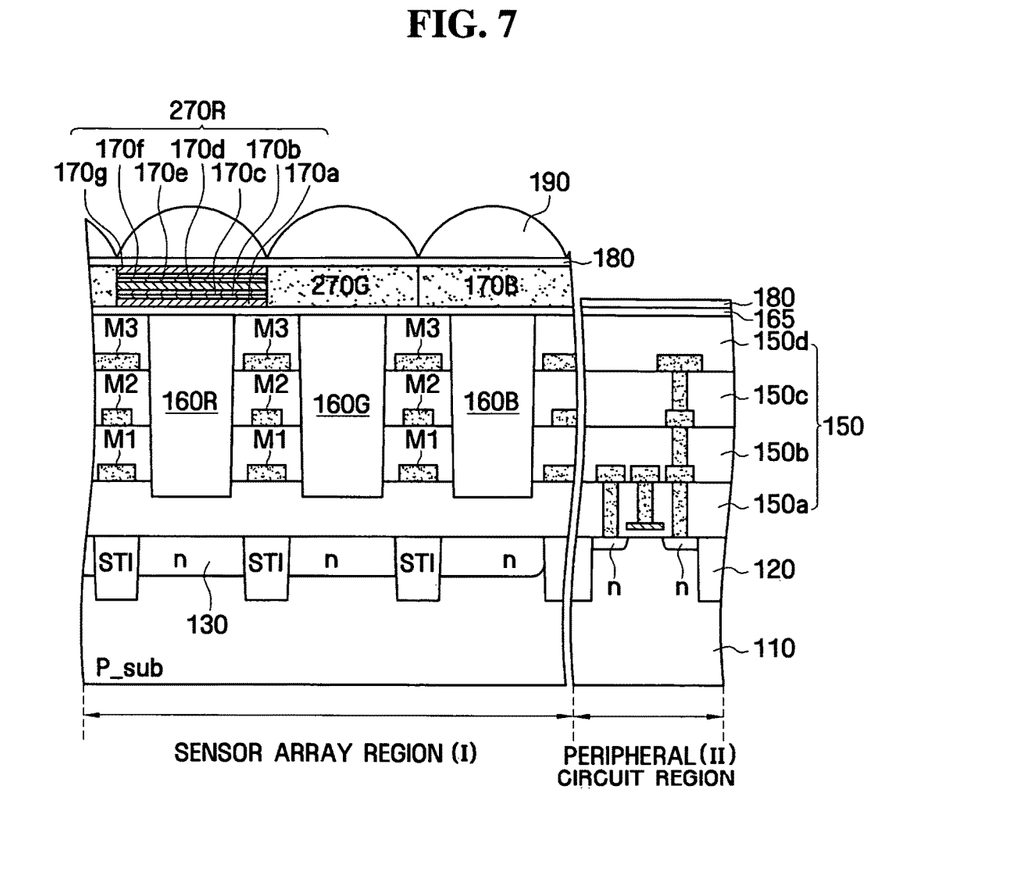
FIGS. 7 and 8 are cross sectional views of an image sensor with multiple types of color filters according to alternative embodiments of the present invention.
Figure 8:
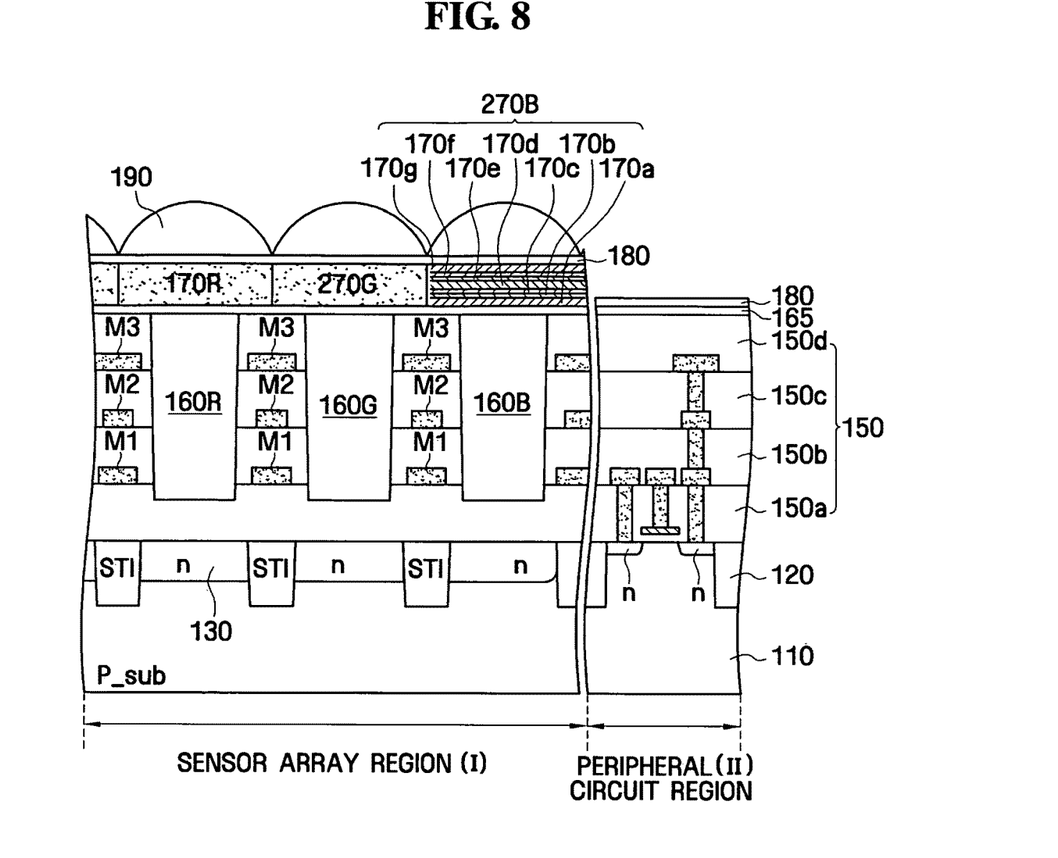

FIGS. 7 and 8 are cross sectional views of an image sensor with multiple types of color filters according to alternative embodiments of the present invention. Elements having the same reference number in FIGS. 3, 7, and 8 refer to elements having similar structure and/or function, and a detailed description thereof is omitted herein.

In a second example embodiment of the present invention in FIG. 7, a red color filter 270R is formed with the multiple inorganic layers 170a, 170b, 170c, 170d, 170e, 170f, and 170g, similarly as described for the green color filter 170G of FIG. 3. Also in FIG. 7, a green color filter 270G and the blue color filter 170B are formed to abut the red color filter 270R and are comprised of respective organic materials. The central wavelength λ of light transmitted by the red color filter 270R is set to the red region, and the thicknesses of the inorganic layers 170a, 170b, 170c, 170d, 170e, 170f, and 170g are adjusted for enhanced spectral characteristics.

In a third example embodiment of the present invention in FIG. 8, a blue color filter 270B is formed with the multiple inorganic layers 170a, 170b, 170c, 170d, 170e, 170f, and 170g, similarly as described for the green color filter 170G of FIG. 3. Also in FIG. 8, a green color filter 270G and the red color filter 170R are formed to abut the blue color filter 270B and are comprised of respective organic materials. The central wavelength λ of light transmitted by the blue color filter 270B is set to the blue region, and the thicknesses of the inorganic layers 170a, 170b, 170c, 170d, 170e, 170f, and 170g are adjusted for enhanced spectral characteristics.

In the above embodiments of FIGS. 3, 7, and 8, one of the red, green, and blue color filters is formed having the multiple inorganic layers 170a, 170b, 170c, 170d, 170e, 170f, and 170g, with the remaining two being formed of respective organic materials. However, the present invention is not limited thereto. For example, one of the red, green, and blue color filters may be formed of an organic material, and the remaining two may be formed of respective multiple inorganic layers.

Figure 9:
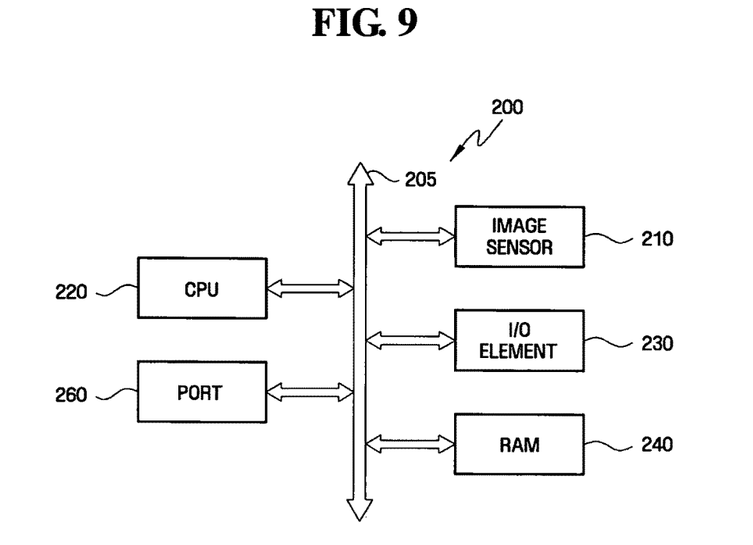
FIG. 9 shows a simplified block diagram of a processor-based system which includes the image sensor of example embodiments of the present invention.

FIG. 9 shows a simplified block diagram of a processor-based system 200 which includes a MOS image sensor 210 that may be the image sensor of example embodiments of the present invention, such as the embodiment of FIG. 3, 7, or 8 for example. Referring to FIG. 9, the processor-based system 200 processes images sensed by the MOS image sensor 210. The system 200 may be a computer system, a camera system, a scanner, a mechanized watch system, a navigation system, a video phone, a security system, an automatic focus system, a tracking system, a motion surveillance system, or an image stabilization system. However, the present invention is not limited thereto.

The processor-based system 200, such as a computer system, includes a central processing unit CPU 220 such as microprocessor for communicating with an I/O device 230 through a bus 205. The MOS image sensor 210 communicates within the system 200 through the bus 205 or with other communication links.

Also, the processor-based system 200 includes a RAM (random access memory) 240 and/or a port 260 for communicating with the CPU 220 through the bus 205. The port 260 connects the processor-based system 200 to a video card, a sound card, a memory card, and a USB device, or the port 260 may be for communicating data with other systems.

The MOS images sensor 210 may be integrated into one chip with the CPU 220, a digital signal processor DSP, or a microprocessor. Also, the MOS image sensor 210 may be integrated into one chip with a memory device. Alternatively, the MOS images sensor 210 and a processor may be formed as separate chips.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. An image sensor comprising:
    a plurality of photoelectric conversion devices formed in a substrate;
    a first color filter formed over a first photoelectric conversion device and comprised of an organic material; and
    a second color filter formed over a second photoelectric conversion device and comprised of a plurality of inorganic layers,
    wherein the second color filter includes a lowest inorganic layer disposed closest to the substrate and includes a highest inorganic layer disposed furthest from the substrate, and wherein the lowest and highest inorganic layers are comprised of a same first inorganic material, and wherein the second color filter includes another inorganic layer comprised of a second inorganic material that is different from the first inorganic material,
    and wherein the second color filter does not include any other inorganic layer disposed above the highest inorganic layer further away from the substrate.

2. The image sensor of claim 1, wherein the second color filter is comprised of alternating layers of the first inorganic material having a first refractive index and the second inorganic material having a second refractive index different from the first refractive index.

3. The image sensor of claim 2, wherein the first refractive index is higher than the second refractive index.

4. The image sensor of claim 3, wherein the second color filter includes said highest and lowest inorganic layers that are thicker than a first intermediate inorganic layer disposed between the highest and lowest inorganic layers with the highest and lowest inorganic layers and the first intermediate inorganic layer being comprised of the first inorganic material, and wherein the second color filter includes outward inorganic layers that are thinner than a second intermediate inorganic layer disposed between the outward inorganic layers with the outward inorganic layers and the second intermediate inorganic layer being comprised of the second inorganic material.

5. The image sensor of claim 3, wherein the first refractive index of the first inorganic material is in a range of from about 1.8 to about 3.0, and wherein the second refractive index of the second inorganic material is in a range of from about 1.2 to about 1.8.

6. The image sensor of claim 5, wherein the first inorganic material is comprised of at least one of $TiO_2$, SiON, $Si_3N_4$, $Ta_2O_3$, and $ZrO_2$, and wherein the second inorganic material is comprised of at least one of an oxide material, a nitride material, and an oxynitride material.

7. The image sensor of claim 1, further comprising:
    light transmitting structures formed between the respective color filters and the respective photoelectric conversion elements; and
    respective lenses formed over the color filters.

8. The image sensor of claim 1, wherein the second color filter abuts the first color filter within a sensor array region of the image sensor.

9. The image sensor of claim 8, further comprising:
    a third color filter formed over a third photoelectric conversion device and comprised of an organic material,
    wherein the second color filter abuts the third color filter within the sensor array region of the image sensor.

10. The image sensor of claim 1, wherein the second color filter abuts a plurality of color filters, each comprised of an organic material.

11. The image sensor of claim 1, wherein the second color filter transmits green light while blocking other colors of light.

12. The image sensor of claim 11, wherein the second color filter transmits green light with substantially 100% transmission efficiency.

13. The image sensor of claim 1, wherein the second color filter transmits blue light while blocking other colors of light.

14. The image sensor of claim 1, wherein the second color filter transmits red light while blocking other colors of light.

15. The image sensor of claim 1, wherein each of the inorganic layers has a respective thickness that is a respective integer multiple of $\lambda/(4ni)$, with $\lambda$ being a central wavelength of light transmitted by the second color filter, and with ni being a respective refractive index of each inorganic layer of the second color filter.

16. The image sensor of claim 1, wherein the first color filter and the second color filter have a substantially same thickness.

17. The image sensor of claim 1, wherein the image sensor is a CMOS (complementary metal oxide semiconductor) image sensor.

* * * * *